US011889653B2

(12) United States Patent
Hasumi (10) Patent No.: US 11,889,653 B2
(45) Date of Patent: Jan. 30, 2024

(54) CABINET AND POWER CONVERTER (71) Applicant: TOSHIBA MITSUBISHI-ELECTRIC INDUSTRIAL SYSTEMS CORPORATION, Chuo-ku (JP)

(72) Inventor: Satoshi Hasumi, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 126 days.

(21) Appl. No.: 17/615,266

(22) PCT Filed: May 1, 2020

(86) PCT No.: PCT/JP2020/018431
§ 371 (c)(1),
(2) Date: Nov. 30, 2021

(87) PCT Pub. No.: WO2021/220509
PCT Pub. Date: Nov. 4, 2021

(65) Prior Publication Data
US 2022/0225520 A1 Jul. 14, 2022

(51) Int. Cl.
H05K 7/16 (2006.01)
H05K 5/02 (2006.01)
H05K 5/03 (2006.01)

(52) U.S. Cl.
CPC ............ H05K 7/16 (2013.01); H05K 5/0226 (2013.01); H05K 5/03 (2013.01)

(58) Field of Classification Search
CPC .......... H05K 7/16; H05K 5/0226; H05K 5/03; H05K 7/14325; E05D 7/04; H02B 1/38
See application file for complete search history.

(56) References Cited

U.S. PATENT DOCUMENTS

| 2001/0011314 A1* | 8/2001 | Gallagher | G06F 9/4406 710/302 |
| 2013/0283566 A1 | 10/2013 | Wach et al. | |
| 2014/0132138 A1* | 5/2014 | Roth | E06B 1/52 49/505 |

FOREIGN PATENT DOCUMENTS

| JP | 59-34418 U | | 3/1984 |
| JP | 7-293094 A | | 11/1995 |
| JP | 07293094 A | * | 11/1995 |
| JP | 2006-183278 A | | 7/2006 |

(Continued)

OTHER PUBLICATIONS

International Search Report dated Aug. 11, 2020 in PCT/JP2020/018431 filed on May 1, 2020, 2 pages.

(Continued)

Primary Examiner — James Wu
Assistant Examiner — Christopher L Augustin
(74) Attorney, Agent, or Firm — Oblon, McClelland, Maier & Neustadt, L.L.P.

(57) ABSTRACT

A power converter includes a cabinet and an electric device accommodated in the cabinet. The cabinet includes a housing, a door, a support member, and a rotation mechanism. The door is rotatably supported around a first axis with respect to the housing. The support member is interposed between the housing and the door to support the door in the housing. The rotation mechanism rotates the door with respect to the housing around a second axis along a direction orthogonal to a plane direction of an opening of the housing.

7 Claims, 7 Drawing Sheets (56) References Cited

FOREIGN PATENT DOCUMENTS

| | | | |
|---|---|---|---|
| JP | 2007-204977 A | 8/2007 | |
| JP | 2015-81479 A | 4/2015 | |
| JP | 2017-218879 A | 12/2017 | |
| KR | 2018034037 A * | 4/2018 | ........... E05D 5/0276 |
| WO | WO-2010085544 A1 * | 7/2010 | ............. E05D 3/122 |

OTHER PUBLICATIONS

Indian Office Action dated Dec. 28, 2022 in Indian Patent Application No. 202117021735, 7 pages.

* cited by examiner

CABINET AND POWER CONVERTER

TECHNICAL FIELD

An embodiment of the present invention relates to a cabinet and a power converter.

BACKGROUND ART

In a cabinet which accommodates an electric device or the like, a configuration is known, which has a door rotatably attached to one side portion of a housing by a hinge (Patent Document 1 (Japanese Unexamined Patent Application, First Publication No. 2006-183278)).

In the cabinet, the door is supported in a cantilever manner, and thus a free end side of the door may be inclined to hang downward.

SUMMARY OF INVENTION

Technical Problem

An object to be solved by the present invention is to provide a cabinet and a power converter capable of easily adjusting an inclination angle of a door.

Solution to Problem

According to an aspect of the present invention, there is provided a cabinet including a housing, a door, a support member, and a rotation mechanism. The housing has an opening on one side surface. The door is rotatably supported around a first axis along the one side surface and is openable or closable to cover at least a portion of the opening. The support member is interposed between the housing and the door to support the door in the housing. The rotation mechanism rotates the door with respect to the housing around a second axis along a direction orthogonal to a plane direction of the opening.

DESCRIPTION OF EMBODIMENTS

Hereinafter, a power converter 10 and a cabinet 1 of an embodiment will be described with reference to the drawings. The power converter 10 supplies desired AC power to an AC electric motor (motor), which is an example of a load.

Figure 1:
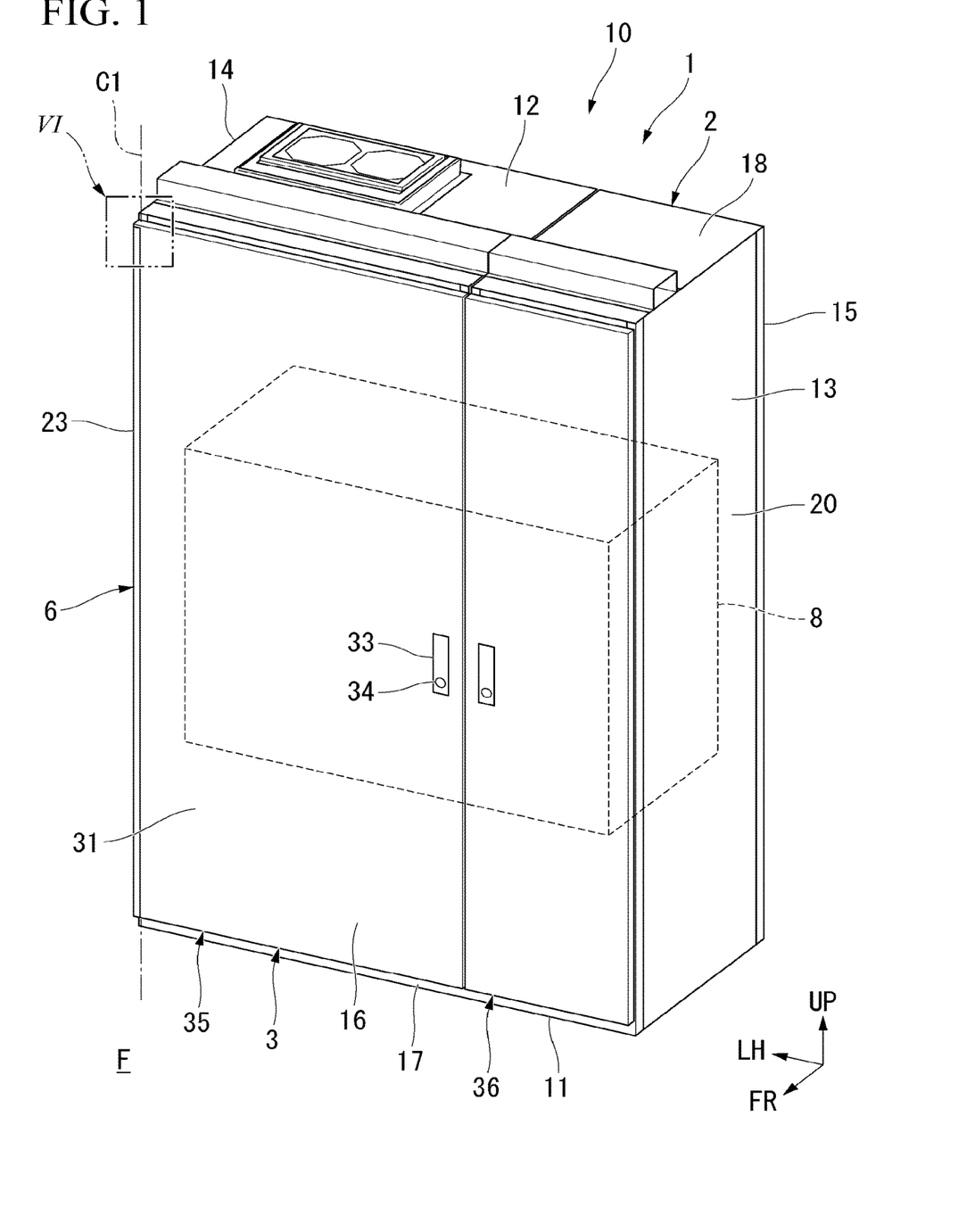
FIG. 1 is an external view of a power converter of an embodiment.

A configuration example of the power converter 10 is shown in FIG. 1. FIG. 1 is an external view of the power converter 10 of the embodiment.

The power converter 10 shown in FIG. 1 includes a cabinet 1 and an electric device 8 accommodated in the cabinet 1. For example, the electric device 8 includes a converter, an inverter, a controller for controlling these, a capacitor, or the like (all not shown). The converter and the inverter are included in a main circuit of the power converter 10. For example, multi-phase AC power (three-phase AC power) is supplied to the power converter 10.

The cabinet 1 is formed in a substantially box shape. The cabinet 1 is installed on a floor surface F.

Here, an UP axis is defined in a vertical direction with respect to the floor surface F, an FR axis is defined in a depth direction of the cabinet 1, and an LH axis is defined in a width direction of the cabinet 1. The UP axis, FR axis, and LH axis are orthogonal to each other. Hereinafter, a case where a height direction of the cabinets 1 is aligned along the vertical direction will be described. In this case, the vertical direction may be referred to as an "up-down direction". A direction toward + (positive) in the FR axis may be referred to as a front surface side, and a direction toward − (negative) in the FR axis may be referred to as a back surface side. A direction toward + (positive) in the LH axis may be referred to as a left side, and a direction toward − (negative) in the LH axis may be referred to as a right side.

As shown in FIG. 1, the cabinet 1 formed in a substantially box shape has a lower surface 11, an upper surface 12, a right surface 13, a left surface 14, a back surface 15, and a front surface 16. The lower surface 11 is a surface in contact with the floor surface F of a base 17. The upper surface 12 is an upper surface of a top plate 18 provided apart from the lower surface 11 upward. The right surface 13, the left surface 14, the back surface 15, and the front surface 16 are side surfaces of the cabinet 1. The right surface 13 and the left surface 14 are provided so as to face each other, and the left surface 14 is located on a left side of the cabinet 1. The back surface 15 and the front surface 16 are provided so as to face each other, and the front surface 16 is located on a front side of the cabinet 1.

For example, the cabinet 1 includes a housing 2, a door 3, a support member 4 (refer to FIG. 2), a rotation mechanism 5 (refer to FIG. 2), and a cover member 6.

First, the housing 2 will be described.

Figure 2:
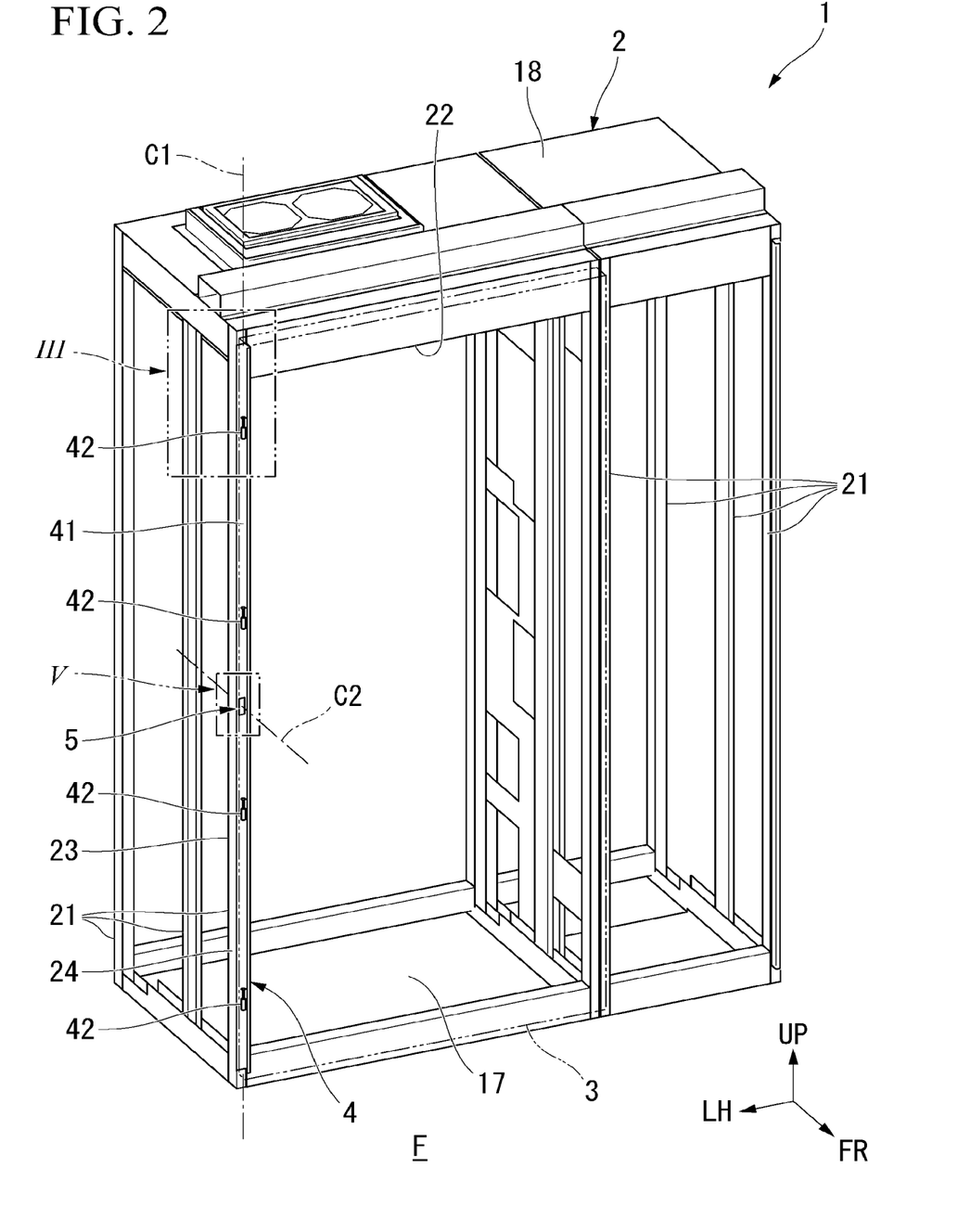
FIG. 2 is an external view of a housing of the embodiment.

FIG. 2 is an external view of the housing 2 of the embodiment. In FIG. 2, for the sake of description, illustration of the electric device 8, some of the plurality of panels 20 described later, or the like is omitted.

The housing 2 shown in FIG. 2 includes the base 17, a frame 21, and the top plate 18.

The base 17 is formed in a rectangular plate shape with the up-down direction as a thickness direction. A plurality of the frames 21 are provided so as to stand up vertically at end portions including four corner portions of the base 17 disposed substantially horizontally. The plurality of frames 21 are connected to each other by a connecting member to form a frame structure. A top plate 18 is provided above the plurality of frames 21, and the plurality of frames 21 support the top plate 18.

For example, the panel 20 is not provided on a front surface (front surface 16) of the housing 2, but the panel 20 is provided on each of a right surface (right surface 13), a left surface (left surface 14), and a back surface (back surface 15) of the housing 2.

As described above, the housing 2 is formed in a box shape having an opening 22 on the front surface (one side surface of claims) of the housing 2. The panels 20 is provided in each of the right surface 13, the left surface 14, and the back surface 15. Inside and outside of the housing 2 are partitioned by the panels 20. The opening 22 provided on the front surface (front surface 16) of the housing 2 enables communication between the inside and outside of the housing 2.

Next, the door 3 will be described.

The door 3 is provided at a position corresponding to the front surface 16 of the cabinet 1. For example, the door 3 has a first door 35 and a second door 36. The first door 35 and the second door 36 can be opened or closed independently, and when used in pairs, they become doors of the double door type cabinet 1. For example, the first door 35 is provided on the left surface 14 side of the front surface 16. The second door 36 is provided on the right surface 13 side of the front surface 16. The cabinet 1 is an example of a double door type cabinet. However, the cabinet 1 is not limited to this and may be a single-sided type cabinet. Hereinafter, the first door 35 will be described in detail as an example. The first door 35 and the second door 36 may be collectively referred to as the door 3, or the first door 35 may be simply referred to as the door 3.

For example, the door 3 (first door 35) is rotatably supported around a first axis C1 along a front end portion of the left surface 14. The first axis C1 serves as an axis of the rotating door 3. The first axis C1 is provided along the up-down direction.

Figure 3:
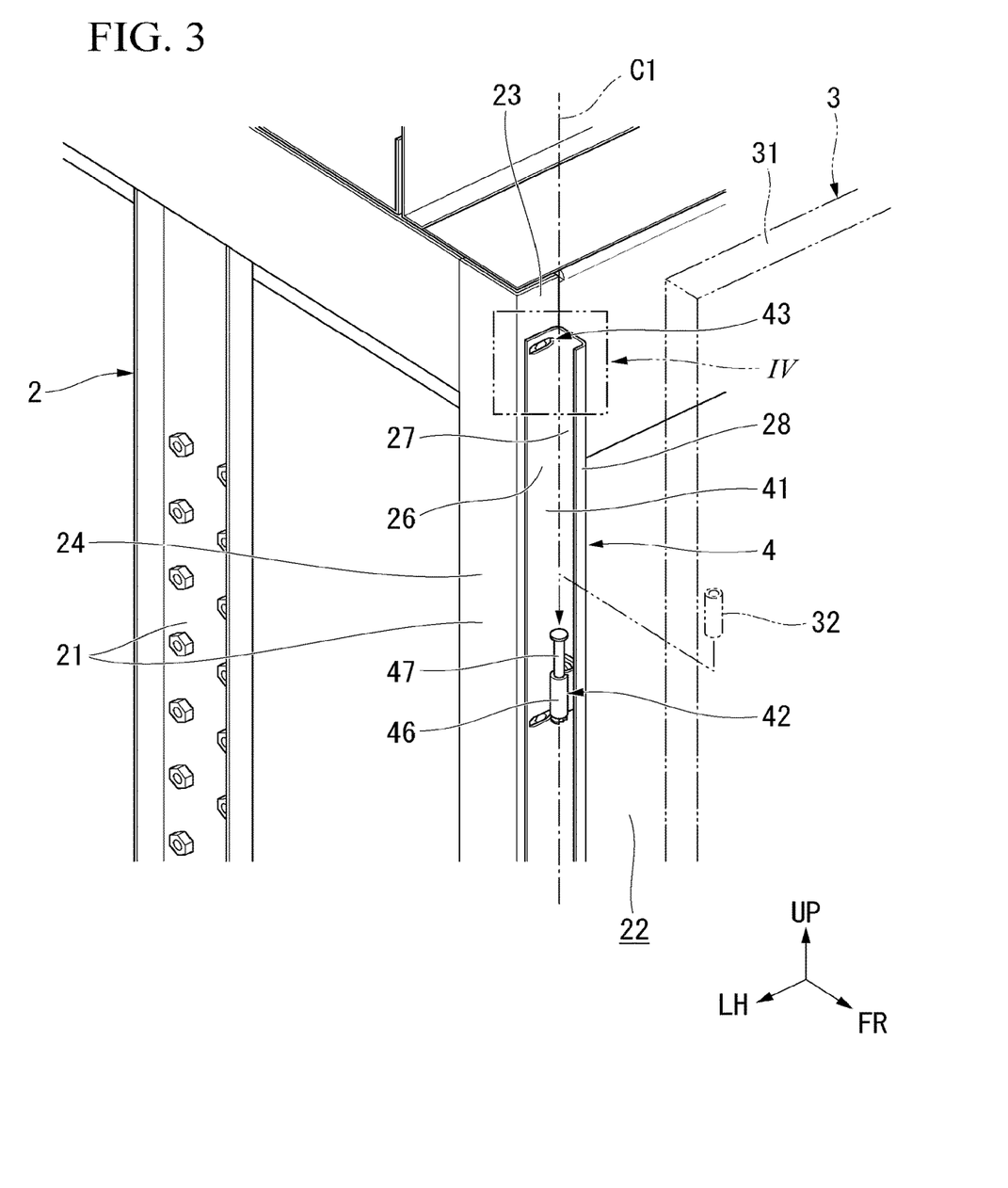
FIG. 3 is an enlarged view of a portion III of FIG. 2.

The door 3 includes a door body 31 and a hinge receiver 32 (refer to FIG. 3).

The door body 31 is formed in a shape of a plate having desired rigidity and thickness, and a peripheral portion thereof is bent. The shape of the door body 31 viewed from a front is a rectangular shape that is long in the up-down direction. The door body 31 may include a vent or the like for ventilation.

The hinge receiver 32 will be described with reference to FIG. 3.

FIG. 3 is an enlarged view of a portion III of FIG. 2. In FIG. 3, a portion of the door 3 is represented by a virtual line for description.

For example, the hinge receiver 32 is formed in a tubular shape centered on the first axis C1. The hinge receiver 32 receives a hinge pin 47 of the hinge 42 described later, and rotates around the first axis C1 with respect to the hinge pin 47.

For example, the hinge receiver 32 is attached to a back surface of the door body 31. The back surface is a surface facing inward of the cabinet 1 in a state where the door 3 is closed. For example, the hinge receiver 32 is fixed to the door body 31 by welding or the like.

Next, the support member 4 that supports the door 3 on the housing 2 will be described.

As shown in FIGS. 2 and 3, the support member 4 is interposed between the housing 2 and the door 3, and supports the door 3 on the housing 2. The support member 4 is provided on a frame 24 located at a boundary portion between the front surface 16 and the left surface 14 of the housing 2. For example, the support member 4 has a substrate portion 41 and the hinge 42.

The hinge 42 has a hinge body 46 and the hinge pin 47.

The hinge body 46 is formed in a tubular shape centered on the first axis C1. This is referred to as a tubular portion. The hinge body 46 receives the hinge pin 47 in the tubular portion.

The hinge pin 47 is inserted into an inner peripheral portion of the hinge body 46 from above. A portion of the hinge pin 47 protrudes upward from an upper end of the tubular portion of the hinge body 46. The hinge pin 47 that protrudes upward from the hinge body 46 is inserted into the hinge receiver 32 provided on the door 3. Accordingly, the door body 31 rotates around a hinge pin 47 (around the first axis C1) between a state (closed state) closed to cover the opening 22 and a state (open state) open toward the outside of the housing 2 with respect to the closed state. Assuming that the first axis C1 side of the door body 31 is a fixed end, a handle 33 and a keyhole 34 for operating the door are provided on a free end side.

Next, the substrate portion 41 on which the hinge 42 is disposed will be described.

The substrate portion 41 has a predetermined length in an extension direction. One hinge or the plurality of hinges 42 disposed on the substrate portion 41 at predetermined positions in the extension direction. The substrate portion 41 locks one or the plurality of hinges 42 disposed to the housing 2.

The extension direction of the substrate portion 41 is disposed along substantially the up-down direction, and the substrate portion 41 is attached to a front surface portion 23 of the frame 21 of the housing 2. For example, as shown in FIG. 2, the substrate portion 41 includes four hinges 42, two fixing portions 43, and the rotation mechanism 5.

For example, the hinge 42 is provided on a central portion side in a longitudinal direction from the fixing portion 43 in the up-down direction. Two hinges (four in total) 42 are provided vertically with the rotation mechanism 5 (refer to FIG. 2) interposed therebetween.

For example, the first axis C1 is defined so as to follow the extension direction of the substrate portion 41. The substrate portion 41 has a surface in which at least a portion to be attached to the frame 21 is formed in a plate shape, and the surface is disposed on the frame 24. The substrate portion 41 has three surfaces formed by bending a sheet metal twice in the extension direction of the substrate portion 41. The substrate portion 41 is formed in an L-shaped cross section in a cross-sectional view orthogonal to a longitudinal direction (up-down direction) of the substrate portion 41. More specifically, the substrate portion 41 has a first portion 26, a second portion 27, and a third portion 28.

The first portion 26 and the second portion 27 are substantially orthogonal to each other. The second portion 27 and the third portion 28 are substantially orthogonal to each other. A rear end portion of the second portion 27 is connected to an inner end portion of the first portion 26 in a right-left direction of the housing 2. A first end portion of the third portion 28 is connected to a front end portion of the second portion 27. A second end portion of the third portion 28 is directed outward in the right-left direction of the housing 2. Each hinge body 46 is attached to the second portion 27. A width dimension of the third portion 28 along the right-left direction is narrower than a width dimension of the first portion 26 along the right-left direction. The substrate portion 41 is rotatably supported by the frame 21 of the housing 2 around a second axis C2 (refer to FIG. 2) of the rotation mechanism 5 described later.

Figure 4:
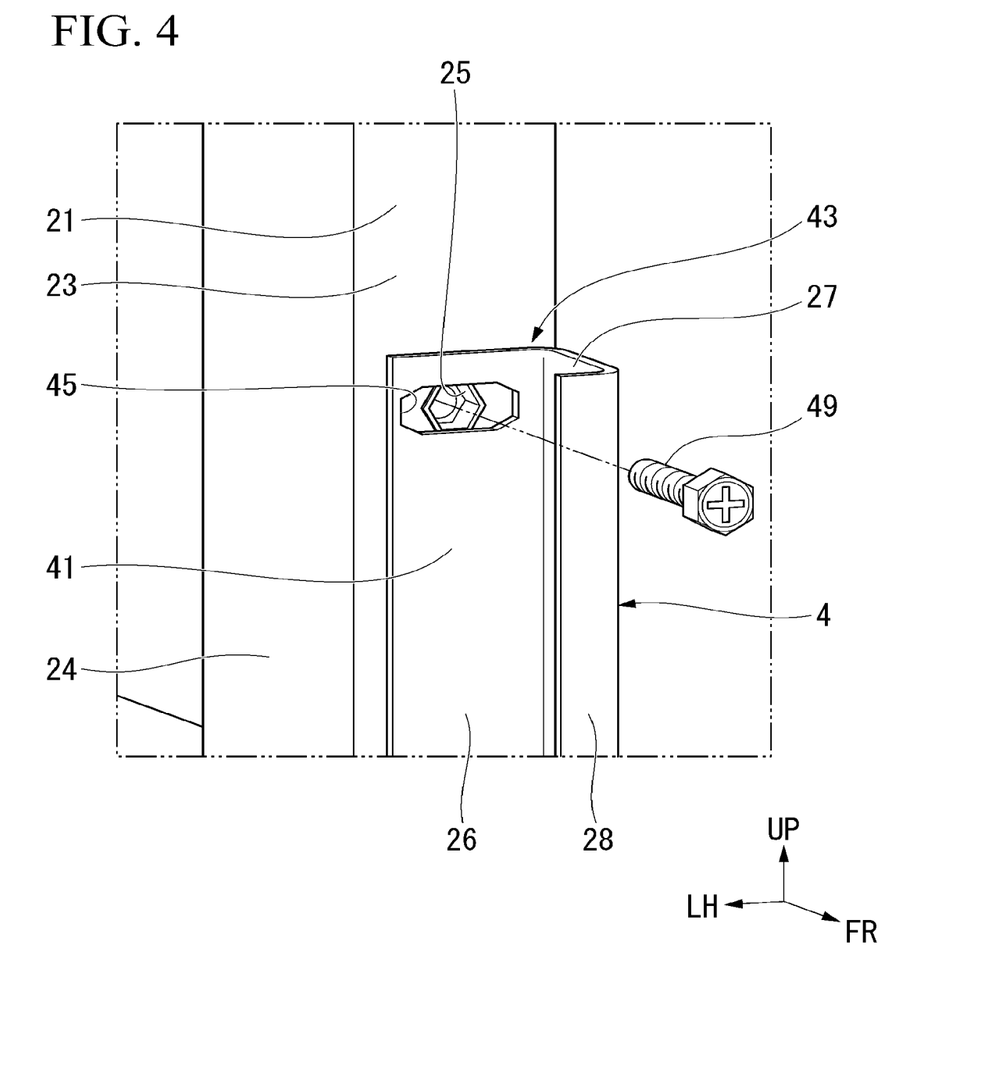
FIG. 4 is an enlarged view of a portion IV of FIG. 3.

FIG. 4 is an enlarged view of a portion IV of FIG. 3.

As shown in FIG. 4, the substrate portion 41 is fixed by the fixing portion 43. The fixing portion 43 is provided in the first portion 26 of the substrate portion 41. The fixing portion 43 locks the substrate portion 41 to the frame 21 of the housing 2. For example, the fixing portion 43 is provided in each of an upper end portion and a lower end portion of the substrate portion 41. The configurations of the fixing portions 43 provided in the upper end portion and the lower end portion of the substrate portion 41 are the same.

The fixing portion 43 allows the substrate portion 41 to rotate by the rotation mechanism 5 described later in a state where the substrate portion 41 is locked to the housing 2. For example, the fixing portion 43 includes the substrate portion 41 in which an elongated hole 45 is formed, a fastening receiving portion 25 of the frame 24, and a fastening member 49.

The elongated hole 45 penetrates the first portion 26 of the substrate portion 41 along a plate thickness direction (front-rear direction) thereof. The elongated hole 45 has a major axis along a direction (right-left direction) orthogonal to the extension direction of the substrate portion 41. Specifically, the elongated hole 45 is formed along an arc shape which is centered on a central portion in the longitudinal direction of the substrate portion 41 and has a length between the central portion in the longitudinal direction and the elongated hole 45 as a radius when viewed from the front. In the present embodiment, a position of the central portion in the longitudinal direction of the substrate portion 41 coincides with a position of the second axis C2 (refer to FIG. 2) of the rotation mechanism 5 described later. That is, the elongated hole 45 extends along a rotation direction of the substrate portion 41 centered on the second axis C2.

The fastening receiving portion 25 is provided at a position corresponding to the elongated hole 45. The fastening member 49 is inserted into the elongated hole 45 and fastened to the fastening receiving portion 25. The substrate portion 41 is fixed to the frame 21 by fastening the fastening member 49 to the fastening receiving portion 25 in a state where the fastening member 49 is inserted into the elongated hole 45.

Next, the rotation mechanism 5 will be described.

As shown in FIG. 2, the rotation mechanism 5 is provided so as to relate to the second axis C2 located at the central portion in the longitudinal direction of the substrate portion 41. The rotation mechanism 5 rotates the door 3 with respect to the housing 2 around the second axis C2 along the direction orthogonal to a plane direction of the opening 22.

Figure 5:
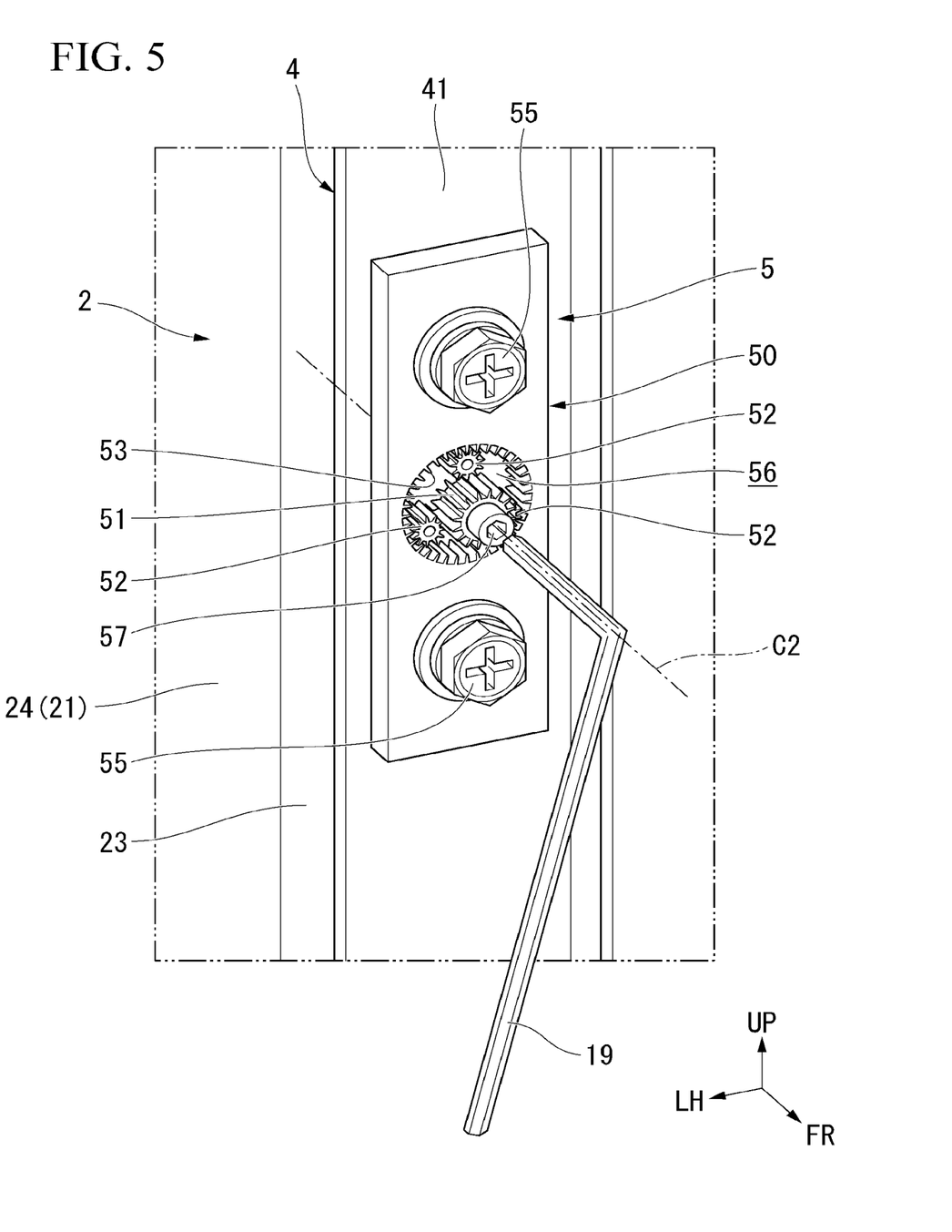
FIG. 5 is an enlarged view of a portion V of FIG. 2.

FIG. 5 is an enlarged view of a V portion of FIG. 2.

The rotation mechanism 5 includes a attachment plate 50, a sun gear 51, and a planetary gear 52.

The attachment plate 50 is formed in a shape of a rectangular plate long in the up-down direction in a plan view viewed from the front. The attachment plate 50 is mounted on a front-facing surface of the first portion 26 (refer to FIG. 3) of the substrate portion 41. The attachment plate 50 is fastened to the substrate portion 41 by two bolts 55 provided vertically apart from each other. A circular through hole 56 is formed between the two bolts 55 of the attachment plate 50. Internal teeth 53 are formed on a peripheral edge portion of the through hole 56. That is, the attachment plate 50 has the internal teeth 53. The internal teeth 53 are provided coaxially with the second axis C2. The internal teeth 53 are provided in either the housing 2 or the door 3. In the present embodiment, the internal teeth 53 are provided in the door 3 via the support member 4 as described above.

The sun gear 51 is disposed inside the through hole 56. The sun gear 51 is disposed inside the internal teeth 53. The sun gear 51 is provided coaxially with the second axis C2. The sun gear 51 is provided on either the housing 2 or the door 3. In the present embodiment, the sun gear 51 is provided in the housing 2. Specifically, a rotating shaft of the sun gear 51 penetrates the support member 4 and is fixed to the frame 21 of the housing 2. A jig receiving port 57 is provided in a front-side (side opposite to the housing 2) end portion of the sun gear 51. For example, the jig receiving port 57 is a recessed portion into which a tool 19 such as a hexagon wrench can be inserted. By inserting the tool 19 into the jig receiving port 57 and turning the tool 19, the sun gear 51 rotates around the second axis C2 with respect to the rotating shaft fixed to the housing 2.

The planetary gear 52 is provided between the sun gear 51 and the internal teeth 53 of the attachment plate 50. In the present embodiment, three planetary gears 52 are provided at equal intervals on an outer peripheral portion of the sun gear 51. Each of the planetary gear 52 meshes with the sun gear 51 and the internal teeth 53 of the attachment plate 50. A rotating shaft of each planetary gear 52 penetrates the support member 4 and is fixed to the frame 21 of the housing 2. That is, a position of the rotating shaft of the planetary gear 52 in the circumferential direction of the sun gear 51 is fixed. The planetary gear 52 cannot revolve around the sun gear 51. The planetary gear 52 can rotate around the rotating shaft of the planetary gear 52.

Next, the cover member 6 will be described.

Figure 6:
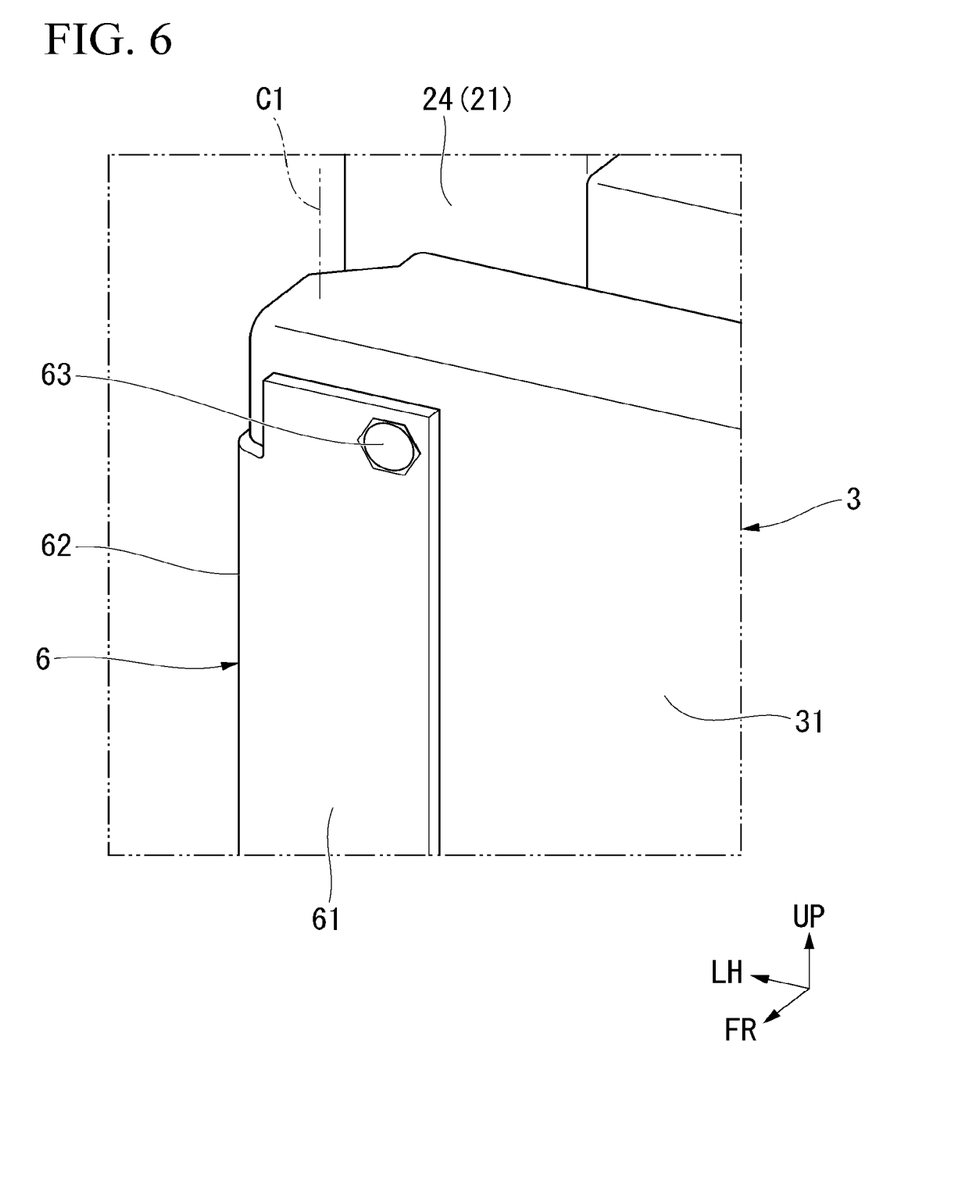
FIG. 6 is an enlarged view of a portion VI of FIG. 1.
Figure 7:
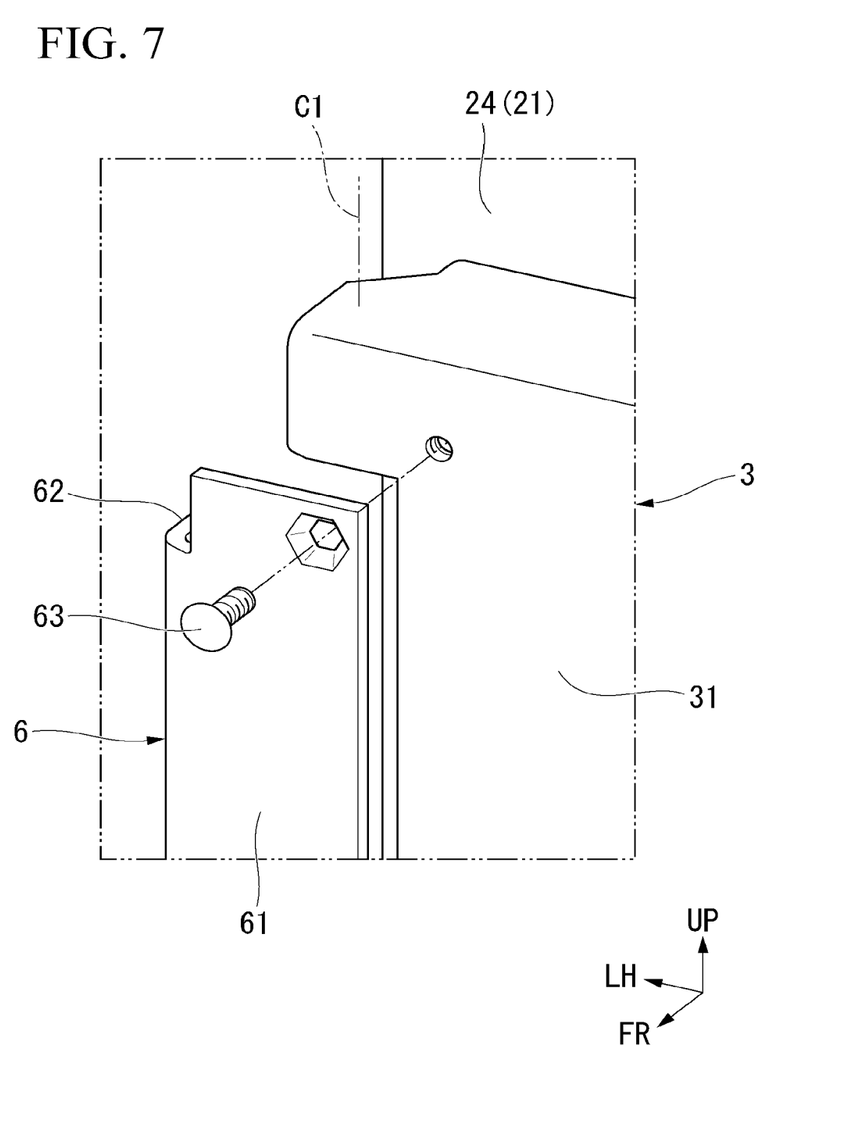
FIG. 7 is an exploded view of a cover member.

FIG. 6 is an enlarged view of a VI portion of FIG. 1. FIG. 7 is an exploded view of the cover member 6. FIG. 7 shows a state in which the cover member 6 is removed from the door 3.

As shown in FIGS. 1 and 6, the cover member 6 is attached to an end portion of the door body 31 on the first axis C1 side. The cover member 6 is provided so as to cover at least the rotation mechanism 5 (refer to FIG. 2) from an outside of the cabinet 1. In the present embodiment, the cover member 6 is provided so as to cover the support member 4 from the outside of the cabinet 1. The cover member 6 is attached to the door 3 to limit the operation of the rotation mechanism 5. A length dimension of the cover member 6 along the up-down direction may be the same as a height dimension of the door body 31 along the up-down direction.

As shown in FIGS. 6 and 7, for example, the cover member 6 includes a front wall portion 61 that covers the front surface of the door body 31 and a side wall portion 62 that covers the side surface of the door body 31, and has an L-shaped cross section. The front wall portion 61 is attached to the door body 31 via an attachment screw 63. A plurality of the attachment screws 63 are provided along the up-down direction. The cover member 6 is detachably attached to the door body 31.

Next, a procedure for rotating the door 3 around the second axis C2 using the above-mentioned rotation mechanism 5 will be described in comparison with a comparative example.

In the case of the comparative example, a door supported in a cantilever manner may be inclined so that a free end side of the door hangs downward due to its own weight when used for many years. In this case, in the comparative example, it may be difficult to adjust an angle of the door.

On the other hand, the rotation mechanism 5 of the present embodiment makes it possible to adjust an inclination of the door 3 by rotating the door 3 around the second axis C2 in a state where the door 3 is attached.

As shown in FIG. 7, in an angle adjustment using the rotation mechanism 5, first, a user releases fastening of the attachment screw 63 and removes the cover member 6 from the door body 31. As shown in FIG. 5, when the cover member 6 is removed, the rotation mechanism 5 is exposed. As a result, the rotation mechanism 5 can be operated.

Next, as shown in FIG. 4, by loosening the fastening member 49 fixing the support member 4 to the housing 2, the support member 4 can rotate around the second axis C2.

Next, the user inserts the tool 19 into the jig receiving port 57 in the rotation mechanism 5. When the user rotates the tool 19 in this state, the sun gear 51 rotates its own axis. Further, the plurality of planetary gears 52 that mesh with the sun gear 51 rotate on their own axes. When the planetary gears 52 rotate on their own axes, the attachment plate 50 having internal teeth 53 that mesh with the planetary gears 52 rotates around the second axis C2 with respect to the housing 2. In this case, a rotation direction of the sun gear 51 and a rotation direction of the attachment plate 50 are opposite to each other. As a result, the support member 4 and the door 3 rotate around the second axis C2 with respect to the housing 2 in an integrated state.

The user adjusts the inclinations of the support member 4 and the door 3 by adjusting an amount of rotation of the sun gear 51 so that the inclination of the door 3 is reduced. In response to this, the rotation mechanism 5 is operated by the user, and thus rotates the door 3 around the second axis C2 with respect to the housing 2. In this case, as the support member 4 rotates, the position of the elongated hole 45 in the longitudinal direction moves with respect to the position of the fastening member 49 that connects the housing 2 and the support member 4.

After the support member 4 and the door 3 have a predetermined angle with respect to the housing, the user fastens the fastening member 49 connecting the housing 2 and the support member 4 while maintaining the predetermined angle. Finally, the cover member 6 is attached to the door body 31 again. Therefore, an angle adjustment of the door 3 is completed.

According to the present embodiment, the cabinet 1 includes the rotation mechanism 5 having a second axis C2 along the direction orthogonal to the plane direction of the opening 22, as a rotation center. The rotation mechanism 5 rotates the door 3 around the second axis C2 with respect to the housing 2. Accordingly, when the free end side of the door 3 supported in a cantilever manner is inclined so as to hang downward, the inclination of the door 3 can be corrected by rotating the door 3 around the second axis C2. Therefore, it is possible to suppress generation of a gap due to the inclination of the door 3 or intrusion of dust into the cabinet 1 through the gap. By providing the rotation mechanism 5 having the second axis C2 as the rotation center, an angle of the door 3 can be adjusted without removing the door 3 from the housing 2. Therefore, a work related to the angle adjustment can be facilitated, and the angle of the door 3 can be adjusted accurately.

Therefore, it is possible to provide the cabinet 1 in which the inclination angle of the door 3 can be easily adjusted.

Moreover, the power converter 10 also has the same effect as that of the cabinet 1.

In the comparative example, when the door 3 is inclined, the positions of a key receiving portion (not shown) on the housing 2 side and the keyhole 34 on the door 3 side may be displaced. Accordingly, it is difficult to insert the key in the comparative example that does not have a rotation mechanism.

On the other hand, according to the cabinet 1 of the present embodiment, since the inclination of the door 3 can be corrected by using the rotation mechanism 5, misalignment between the key receiving portion and the keyhole 34 can be reduced. Therefore, it is possible to suppress an operation failure when inserting the key into the keyhole 34 and further enhance a convenience of the cabinet 1.

The support member 4 includes the substrate portion 41 having the fixing portion 43 and the hinge 42. The fixing portion 43 allows the rotation mechanism 5 to rotate the substrate portion 41 in the state where the substrate portion 41 is locked to the housing 2. Accordingly, the support member 4 can be rotated around the second axis C2 with respect to the housing 2. The door 3 is supported by the support member 4 in an openable or closable manner via the hinge 42. Therefore, when the support member 4 rotates around the second axis C2, the door 3 rotates around the second axis C2 together with the support member 4. Since the door 3 and the housing 2 are connected to each other via the support member 4, the angle of the door 3 can be adjusted without removing the door 3 from the housing 2.

Further, by providing the rotation mechanism 5 not in the door 3 but in the support member 4, the angle can be easily adjusted without complicating the configuration of the door 3.

The substrate portion 41 is formed in a plate shape. An elongated hole 45 through which the fastening member 49 connecting the housing 2 and the support member 4 to each other is inserted and which is formed along a rotation direction of the door 3 around the second axis C2 is formed in a surface of the substrate portion 41. As a result, when the support member 4 is rotated, the rotation of the support member 4 with respect to the housing 2 is allowed, and thus a relative position of the fastening member 49 with respect to the elongated hole 45 can be changed. Therefore, the angle of the support member 4 can be adjusted in a state where the fastening member 49 is inserted, that is, in a state where the support member 4 is attached to the housing 2.

The rotation mechanism 5 may be provided at the central portion of the substrate portion 41 in the longitudinal direction. Accordingly, the door 3 can be rotated around the second axis C2 with the central portion of the substrate portion 41 in the longitudinal direction, that is, the central portion of the door 3 in the up-down direction as the rotation center. Therefore, when the angle of the door 3 is adjusted, an amount of displacement between the door 3 and the housing 2 can be kept small. Accordingly, an appearance quality of the door 3 after adjusting the angle can be improved.

The rotation mechanism 5 has a jig receiving port 57 and is operated by a person, and thus, the door 3 is rotated around the second axis C2 with respect to the housing 2. The user can rotate the door 3 to a desired angle by inserting the jig into the jig receiving port 57 and rotating the jig. Since the angle of the door 3 is adjusted according to the amount of rotation of the jig, the user can adjust the angle of the door 3 with high accuracy by operating the jig while observing a state of the door 3.

The rotation mechanism 5 may include a planetary gear mechanism having the sun gear 51, planetary gear 52, and internal teeth 53. Thereby, the angle of the door 3 can be easily adjusted using the rotation mechanism 5 having a simpler structure. Further, by using any of the gears of the rotation mechanism 5, a rotational force based on the operation of the user can be efficiently converted into a rotational force of the door 3.

The cabinet 1 may include the cover member 6 that covers the rotation mechanism 5. As a result, it is possible to prevent the rotation mechanism 5 from being exposed to the outside during normal use without adjusting the angle of the door 3. Therefore, it is possible to suppress an unintended external force from being input to the rotation mechanism 5 and prevent the door 3 from unexpectedly rotating around the second axis C2. The cover member 6 is detachable from the door 3. Therefore, when adjusting the angle of the door 3, the rotation mechanism 5 can be easily accessed by removing the cover member 6. Therefore, usability of the cabinet 1 can be improved during normal use and when adjusting the angle of the door 3.

The power converter 10 may include the above-mentioned cabinet 1 and the electric device 8 accommodated in the cabinet 1. Here, in the power converter 10 in which the high-voltage electric device 8 or the like is accommodated, if dust, foreign matters, or the like enters the cabinet 1, the internal electric device 8 may be affected. Therefore, it is necessary to suppress the gap between the housing 2 and the door 3. According to the power converter 10, since the power converter 10 includes the above-mentioned cabinet 1, the angle of the door 3 can be adjusted using the rotation mechanism 5 when the door 3 is inclined. As a result, it is possible to suppress the generation of the gap between the door 3 and the housing 2 due to the inclination of the door 3. Therefore, it can be suitably used in the power converter 10 which is particularly required to be hermetically sealed.

According to at least one embodiment described above, the housing 2 has the opening 22 on one side surface (front surface 16). The door 3 is rotatably supported around the first axis C1 along one side surface, and can be opened or closed so as to cover at least a part of the opening 22. The support member 4 is interposed between the housing 2 and the door 3, and supports the door 3 in the housing 2. The rotation mechanism 5 can easily adjust the inclination angle of the door 3 by rotating the door 3 with respect to the housing 2 around the second axis C2 along the direction orthogonal to the plane direction of the opening 22.

Although some embodiments of the present invention are described, these embodiments are presented as examples and are not intended to limit a scope of the invention. These embodiments can be implemented in various other forms, and various omissions, replacements, and changes can be made within a scope which does not depart from a gist of the invention. These embodiments or modifications thereof are included in the scope or gist of the invention, as well as in the scope of the invention described in the claims and the equivalent scope thereof.

For example, in the above description of the embodiment, the configuration in which the internal teeth 53 are provided in the door 3 via the support member 4 and the sun gear 51 is provided in the housing 2 is described. However, the present invention is not limited to this. The sun gear 51 may be provided in the door 3, and the internal teeth 53 may be provided in the housing 2.

In the above description of the embodiment, the configuration having the two doors 3 of the first door 35 and the second door 36 is described. However, the number of the doors 3 is not limited to the above-mentioned embodiment. The cabinet 1 may be configured to have one door 3. When a plurality of doors 3 are provided, each door 3 may include the rotation mechanism 5.

The cover member 6 may be provided in a portion of the door 3 in the up-down direction. A shape of the cover member 6 or a method of attaching the cover member 6 to the door 3 is not limited to the above-mentioned embodiment. That is, the cover member 6 may cover at least the rotation mechanism 5, and may be detachably attached to the door 3 by, for example, snap fitting that does not use a screw.

REFERENCE SIGNS LIST

1: Cabinet
2: Housing
3: Door
4: Support member
5: Rotation mechanism
6: Cover member
8: Electric device
10: Power converter
16: Front surface (one side surface)
22: Opening
41: Substrate portion
42: Hinge
43: Fixing portion
45: Elongated hole
49: Fastening member
51: Sun gear
52: Planetary gear
53: Internal teeth
57: Jig receiving port
C1: First axis
C2: Second axis

What is claimed is:

1. A cabinet comprising:
a housing including an opening on one side surface;
a door that is rotatably supported around a first axis along the one side surface and is openable or closable to cover at least a portion of the opening;
a support member that is interposed between the housing and the door to support the door in the housing; and
a rotation mechanism that rotates the door with respect to the housing around a second axis along a direction orthogonal to a plane direction of the opening,
wherein the support member includes:
a substrate portion that extends along the first axis and is locked to the housing by a fixing portion and rotatably supported by the housing around the second axis, and
a hinge that is attached to the substrate portion and rotatably supports the door around the first axis,
wherein the fixing portion allows a rotation by the rotation mechanism in a state where the fixing portion is locked to the housing.

2. The cabinet according to claim 1,
wherein the substrate portion is formed in a plate shape, and
an elongated hole through which a fastening member connecting the housing and the support member is inserted and which is provided along a rotation direction of the door around the second axis is provided in a surface of the substrate portion.

3. The cabinet according to claim 1,
wherein the rotation mechanism is provided at a central portion in a longitudinal direction of the substrate portion.

4. The cabinet according to claim 1,
wherein the rotation mechanism includes a jig receiving port and is operated by a person to rotate the door around the second axis with respect to the housing.

5. The cabinet according to claim 1,
wherein the rotation mechanism includes:
a sun gear that is provided in one of the housing and the door and rotates around the second axis,
a plurality of planetary gears that are disposed in an outer peripheral portion of the sun gear and rotate around a rotating shaft of which a position in a circumferential direction of the sun gear is fixed, and
internal teeth that are attached to the other of the housing and the door and mesh with the planetary gears.

6. The cabinet according to claim 1, further comprising:
a cover member that covers at least the rotation mechanism.

7. A power converter comprising:
the cabinet according to claim 1, and
an electric device accommodated inside the cabinet.

* * * * *